United States Patent
Song

(10) Patent No.: US 10,566,970 B2
(45) Date of Patent: Feb. 18, 2020

(54) POWER SWITCH DRIVE CIRCUIT WITH BUILT-IN POWER SUPPLY CAPACITOR

(71) Applicant: SHENZHEN WINSEMI MICROELECTRONICS CO., LTD., Shenzhen, Guangdong (CN)

(72) Inventor: Lijun Song, Guangdong (CN)

(73) Assignee: SHENZHEN WINSEMI MICROELECTRONICS CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/078,923

(22) PCT Filed: Jun. 2, 2017

(86) PCT No.: PCT/CN2017/086944
§ 371 (c)(1),
(2) Date: Aug. 22, 2018

(87) PCT Pub. No.: WO2018/218639
PCT Pub. Date: Dec. 6, 2018

(65) Prior Publication Data
US 2019/0312576 A1    Oct. 10, 2019

(51) Int. Cl.
*H03K 17/687* (2006.01)
*H03K 17/22* (2006.01)
*H02M 3/07* (2006.01)

(52) U.S. Cl.
CPC ............ *H03K 17/223* (2013.01); *H02M 3/07* (2013.01)

(58) Field of Classification Search
CPC ............... H03K 17/063; H02M 3/1588; Y02B 70/1466
See application file for complete search history.

(56) References Cited

U.S. PATENT DOCUMENTS

2014/0091643 A1* 4/2014 Norling .............. H03K 17/0822
307/130

FOREIGN PATENT DOCUMENTS

| CN | 103152951 A | 6/2013 |
|---|---|---|
| CN | 105048790 A | 11/2015 |
| CN | 204928568 U | 12/2015 |
| CN | 106300962 A | 1/2017 |

* cited by examiner

*Primary Examiner* — Sibin Chen
(74) *Attorney, Agent, or Firm* — Muncy, Geissler, Olds & Lowe, P.C.

(57) ABSTRACT

A power switch drive circuit with a built-in power supply capacitor, when the power switch (M1) reaches the turn-on threshold, it is discharged through the power supply capacitor (Cvcc) to turn on the power switch (M1), thereby saving the charge requirement on the power supply capacitor (Cvcc), and enabling a small-capacity power supply capacitor (Cvcc) to realize power switch (M1) driving. At the same time, the power supply capacitor (Cvcc) can be designed in an integrated circuit to improve reliability and reduce costs, therefore, it can solve the problem that the capacity of the power supply capacitor is too large to be able to be designed on the integrated circuit, which results in a large occupied space and an increased cost.

6 Claims, 5 Drawing Sheets

POWER SWITCH DRIVE CIRCUIT WITH BUILT-IN POWER SUPPLY CAPACITOR

TECHNICAL FIELD

The present application relates to the technical field of drive circuits, and more particularly to a power switch drive circuit with a built-in power supply capacitor.

BACKGROUND

Applications such as AC/DC power supply with alternating current input or LED driver or the like have a power supply capacitor. The charge stored in the power supply capacitor is used for controlling an internal circuit of a chip and driving a power switch. When a field effect transistor is driven to be turned on, it is required to quickly drive its gate voltage to an appropriate voltage (typically 5V-15V) to achieve a small on-resistance between the drain and source.

FIG. 1 shows an examplary circuit relating to a power switch drive circuit in the prior art. The power switch drive circuit includes a rectifier bridge (including a diode D1, a diode D2, a diode D3, and a diode D4), a bus capacitor Cbus, an inductor Lm. a freewheel diode Dr, an output capacitor Cout, a load Rload, and a drive chip; the drive chip further includes a power switch M1, a junction field effect transistor JFET, a JFET control circuit, and a drive circuit; of which the source of the junction field effect transistor JFET is connected with a power supply capacitor Cvcc. The power supply capacitor Cvcc supplies power to the driver circuit and drives the gate of the power switch M1. A source of the power switch M1 is connected with a sampling resistor Rcs.

Since the drain of the junction field effect transistor JFET is connected with the drain of the power switch M1, when the power switch M1 is turned off, the drain voltage of the power switch M1 is 100V-400V. Therefore, the junction field effect transistor JFET can charge the power supply capacitor Cvcc, and the charging process is controlled by the JFET control circuit. When the voltage of the power supply capacitor Cvcc is insufficient, the junction field effect transistor JFET is turned on; and when the voltage of the power supply capacitor Cvcc is sufficient, the junction field effect transistor JFET is turned off, and the supply of the JFET control circuit can continue several switching cycles of the power switch M1.

When the power switch M1 is switched from an off state to an on state, the drive circuit pulls a gate voltage of the power switch M1 from 0V to a power supply capacitor Cvcc voltage, the gate charge of the power gate M1 is provided by the power supply capacitor Cvcc; and when the power switch M1 is switched from the on stated to the off state, the drive circuit pulls the gate voltage of the power switch M1 down to 0V.

However, the above power supply capacitor Cvcc requires a relatively large capacity (typically calculated in terms of nanofarad nF or microfarad uF), therefore cannot be designed in an integrated circuit, and requires a separately packaged capacitor. Firstly, the power supply capacitor requires cost, and occupies space; secondly, the dedicated pins of the integrated circuit also occupies the system cost; and thirdly, the risk of system failure is increased.

Therefore, the existing power driver circuit has a problem that the capacity of the power supply capacitor is too large to be able to be designed on the integrated circuit, which results in a large occupied space and an increased cost.

SUMMARY

An object of the present application is to provide a power switch drive circuit with a built-in power supply capacitor to solve the problem that the capacity of the power supply capacitor is too large to be able to be designed on the integrated circuit, which results in a large occupied space and an increased cost.

The present application provides a power switch drive circuit with a built-in power supply capacitor, the power switch drive circuit comprises a drive unit, the drive unit comprises a power switch, a junction field effect transistor, a field effect transistor control circuit, and a drive control circuit, the drive unit also comprises:

a logic circuit, a power supply diode, a first switch module, a second switch module, a third switch module, and a power supply capacitor;

an output end of the field effect transistor control circuit is connected with the gate of the junction field effect transistor, the drain of the junction field effect transistor and an input end of the power switch are connected with a power supply unit, a source of the junction field effect transistor, an input end of the first switch module, a connection end of the drive control circuit, and an anode of the power supply diode are connected in common; a first control end of the drive control circuit is connected with a controlled end of the first switch module, a second control end of the drive control circuit is connected with the controlled end of the second switch module, a cathode of the power supply diode and a first end of the power supply capacitor, and an input end of the second switch module are connected in common, an output end of the first switch module, an output end of the second switch module, an input end of the third switch module, and a controlled end of the power switch are connected in common, a second end of the power supply capacitor and an output end of the third switch module are grounded, a control end of the logic circuit is connected with a controlled end of the drive control circuit, an output of the logic circuit is connected with a controlled end of the third switch module, an connection end of the logic circuit and an output end of the power switch are connected in common with an output unit;

the direct current output by the power supply unit not only charges the power supply capacitor but also supplies power to the power switch;

when the logic circuit outputs a turn-on control signal, the drive control circuit controls the first switch module to be turned on, and controls the first switch module to be turned off and the second switch module to be turned on when the power switch reaches a turn-on threshold, while the power supply capacitor is discharged to turn on the power switch; and when the logic circuit outputs a turn-off control signal, the third switch module is turned on, and the drive control circuit controls the second switch module turned off, so that the power supply capacitor is charged and the power switch is turned off.

In summary, the present application provides a power switch drive circuit with a built-in power supply capacitor, when the power switch reaches the turn-on threshold, it is discharged through the power supply capacitor to turn on the power switch, thereby saving the charge requirement on the power supply capacitor, and enables a small-capacity power supply capacitor to realize power switch driving. At the same time, the power supply capacitor can be designed in an integrated circuit to improve reliability and reduce costs, therefore, it can solve the problem that the capacity of the power supply capacitor is too large to be able to be designed on the integrated circuit, which results in a large occupied space and an increased cost.

DETAILED DESCRIPTION OF THE EMBODIMENTS

In order to make the purpose, technical solutions, and beneficial effects of the present application clearer and more understandable, the present application will be further described in detail herein after with reference to the accompanying drawings and embodiments. It should be understood that the embodiments described herein are only intended to illustrate but not to limit the present application.

The present application provides a power switch drive circuit with a built-in power supply capacitor, when the drive power switch is turned on, the first switch module is first turned on. When a drain voltage of the power switch drops to a preset value or a preset time, the first switch module is turned off and the second switch module is turned on, while the power supply capacitor discharges to turn on the power switch, thereby saving the charge requirement on the power supply capacitor, and enables a small-capacity power supply capacitor to realize power switch driving.

In order to explain the technical solutions described in the present application, the following description will be given through specific embodiments.

Figure 1:
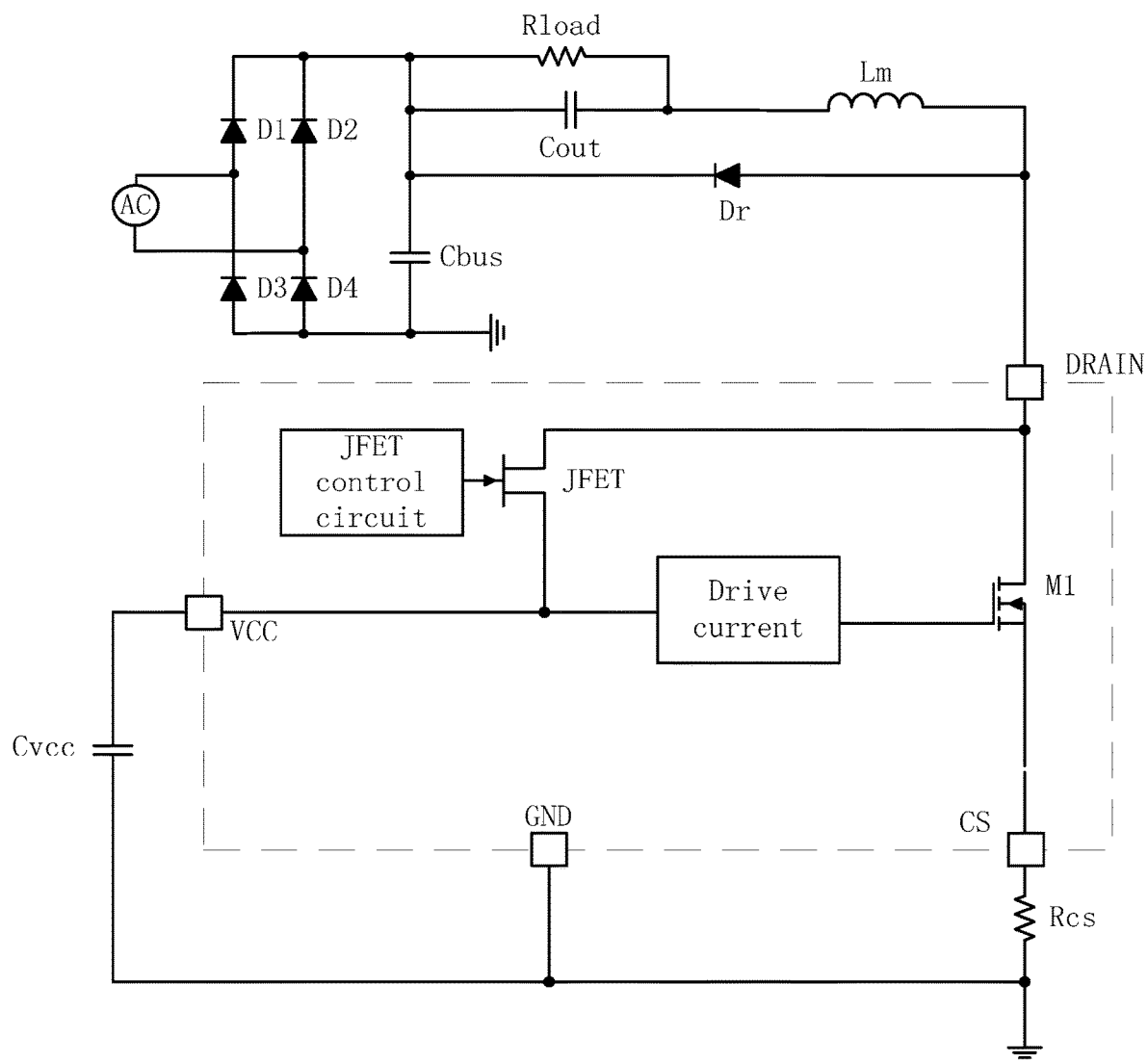
FIG. 1 is an exemplary circuit diagram of a power switch drive circuit related in the prior art.
Figure 2:
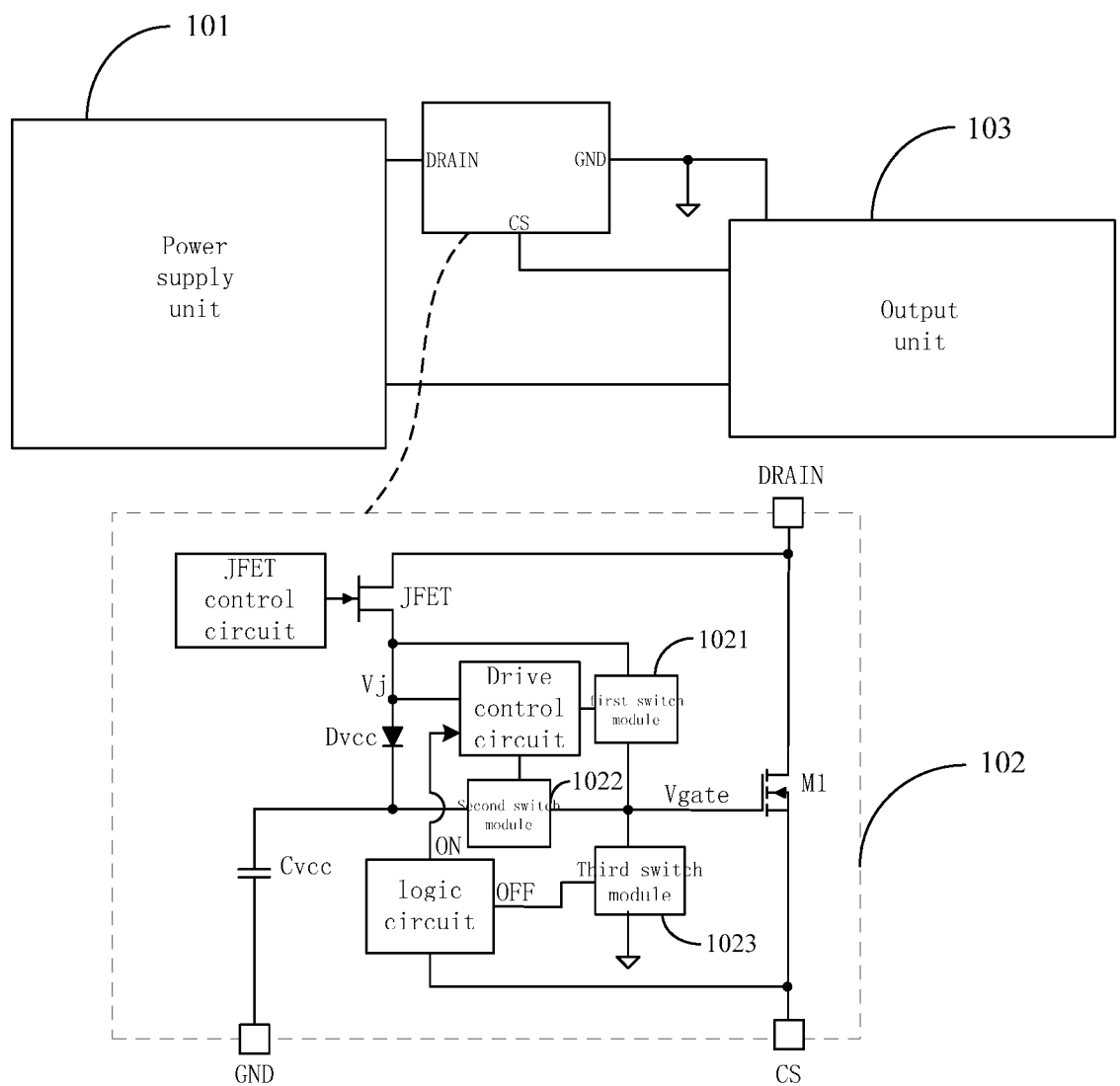
FIG. 2 is a schematic structural diagram of a power switch drive circuit with a built-in power supply capacitor according to an embodiment of the present application.

FIG. 2 shows a module structure of a power switch drive circuit with a built-in power supply capacitor according to an embodiment of the present application. For ease of description, only the parts related to the embodiment of the present application are shown, which are described in detail as follows:

For the power switch drive circuit with a built-in power supply capacitor, the power switch drive circuit comprises a drive unit 102, the drive unit 102 comprises a power switch M1, a junction field effect transistor JFET, a field effect transistor control circuit (which is represented by JFET control circuit in FIG. 2), and a drive control circuit, and the drive unit also comprises:

a logic circuit, a power supply diode Dvcc, a first switch module 1021, a second switch module 1022, a third switch module 1023, and a power supply capacitor Cvcc;

an output end of the field effect transistor control circuit is connected with the gate of the junction field effect transistor JFET, a drain of the junction field effect transistor JFET and an input end of the power switch M1 are connected with a power supply unit 101, a source of the junction field effect transistor JFET, an input end of the first switch module 1021, a connection end of the drive control circuit, and an anode of the power supply diode Dvcc are connected in common; a first control end of the drive control circuit is connected with a controlled end of the first switch module 1021, a second control end of the drive control circuit is connected with a controlled end of the second switch module 1022, a cathode of the power supply diode Dvcc and a first end of the power supply capacitor Cvcc, and an input end of the second switch module 1022 are connected in common, an output end of the first switch module 1021, an output end of the second switch module 1022, an input end of the third switch module 1023, and a controlled end of the power switch M1 are connected in common, a second end of the power supply capacitor Cvcc and an output end of the third switch module 1023 are grounded, a control end of the logic circuit is connected with a controlled end of the drive control circuit, an output of the logic circuit is connected with a controlled end of the third switch module 1023, an connection end of the logic circuit and an output end of the power switch M1 are connected in common with an output unit 103;

the direct current output by the power supply unit 101 not only charges the power supply capacitor Cvcc but also supplies power to the power switch M1;

when the logic circuit outputs a turn-on control signal, the drive control circuit controls the first switch module 1021 to be turned on, and controls the first switch module 1021 to be turned off and the second switch module 1022 to be turned on when the power switch M1 reaches a turn-on threshold, while the power supply capacitor Cvcc is discharged to turn on the power switch M1.

when the logic circuit outputs a turn-off control signal, the third switch module 1023 is turned on, and the drive control circuit controls the second switch module 1022 turned off, so that the power supply capacitor Cvcc is charged and the power switch M1 is turned off.

As an embodiment of the present application, the power switch M1 is specifically a field effect transistor. The gate, the drain and the source of the field effect transistor correspond to the controlled end, the input end and the output end of the power switch M1 respectively. The power switch M1 is a control object for driving the control circuit and a main switch in the circuit, when the power switch M1 is required to be turned on, the gate-source voltage Vgate of the power switch M1 needs to be driven to a voltage of 5V-15V to obtain a proper on-resistance; when the power switch is required to be turned off, the gate-source voltage Vgate of the power switch needs to be driven to 0V so that the power switch M1 is turned off. When the power switch M1 is turned off, the drain voltage of the power switch M1 is relatively high, in applications where the mains power is input, the drain voltage is usually 100V to 500V. By controlling the gate of the junction field effect transistor JFET reasonably the current in the junction field effect transistor JFET can be controlled to charge the drive control circuit.

As an embodiment of the present application, the power supply diode Dvcc serves is for the purpose of making the power supply current unidirectionally conductive, when the source Vj voltage of the junction field-effect transistor JFET is lower than the power supply capacitor Cvcc, the power-supply capacitor Cvcc voltage is blocked to avoid the flow direction to the Vj thereof.

As an embodiment of the present application, the input signal of the drive control circuit is the output end ON of the logic circuit and the source Vj of the junction field effect transistor JFET. The output signal of the drive control circuit controls on state and off state of the first switch module 1021 and the second switch module 1022. The logic circuit is the internal logic of the control chip, and the power switch M1 is turned on and off according to the voltage on the sampling resistor Rcs and the output signal of the other working state of the circuit.

As an embodiment of the present application, the field effect transistor control circuit drives the junction field effect transistor JFET to supply the power supply capacitor Cvcc by the power supply diode Dvcc.

Figure 3:
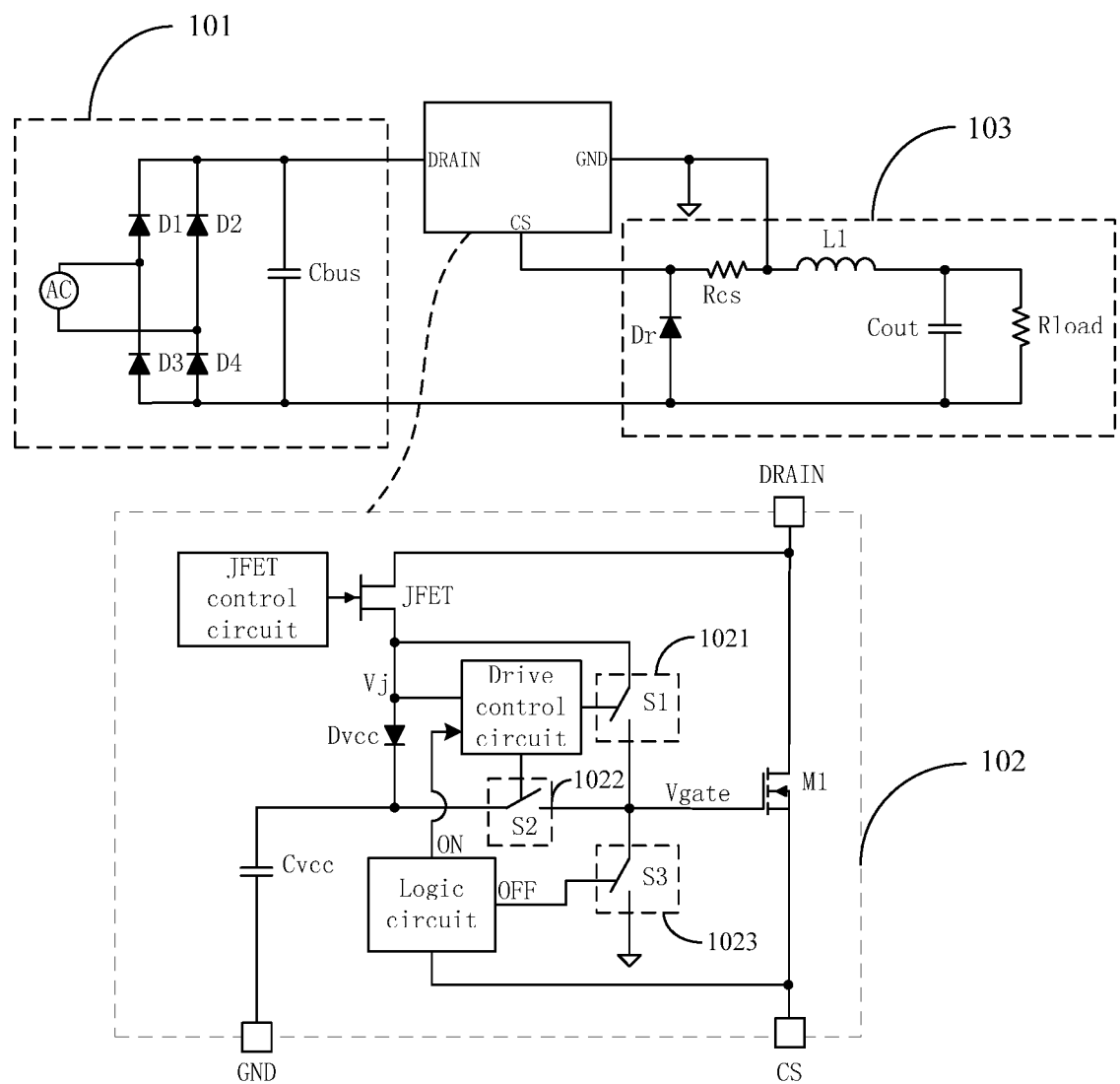
FIG. 3 is an exemplary circuit diagram of a power switch driving circuit with a built-in power supply capacitor according to an embodiment of the present application.

FIG. 3 shows an exemplary circuit of a power switch drive circuit with a built-in power supply capacitor according to an embodiment of the present application. For convenience of description, only the parts related to the embodiment of the present application are shown, which are described in detail as follows:

As an embodiment of the present application, the above power supply unit 101 comprises:

an alternating current power supply AC, a first diode D1, a second diode D2, a third diode D3, a fourth diode D4 and the bus capacitor Cbus;

a first output end of the alternating current power source AC, an anode of the first diode D1 and a cathode of the third diode D3 are connected in common, a second output end of the alternating current power source AC, a cathode of the fourth diode D4 and an anode of the second diode D2 are connected in common, a cathode of the first diode D1, a cathode of the second diode D2 and the first end of the bus capacitor Cbus are connected in common to serves as an output end of the power supply unit 101, an anode of the third diode D3, an anode of the fourth diode D4 and the second end of the bus capacitor Cbus are connected in common.

The above first diode D1, the second diode D2, the third diode D3 and the fourth diode D4 form a rectifier bridge, the input of the rectifier bridge is alternating current voltage, the output is connected with the bus capacitor Cbus, and the bus capacitor Cbus provides a path to the high-frequency pulse current of the switching power supply, and stores the energy of the commercial alternating current voltage in the bus capacitor Cbus.

As an embodiment of the present application, the above output unit 103 comprises:

a sampling resistor Rcs, a inductor L1, an output capacitor Cout, a freewheel diode Dr, and load;

a first end of the sampling resistor Rcs and a cathode of the freewheel diode Dr are connected to serves as an input of the output unit 103. A second end of the sampling resistor Rcs and a first end of the inductor L1 are grounded, and a second end of the inductor L1, a first end of the output capacitor Cout and a first end of the load are connected in common, an anode of the freewheel diode Dr, a second end of the output capacitor Cout and a second end of the load are connected in common and are connected with a second end of the bus capacitor Cbus.

When the power switch M1 is turned on, the current of the inductor L1 rises; when the power switch M1 is turned off, the current of the inductor L1 drops, and the current in the inductor L1 flows through the freewheeling diode Dr. The output capacitor Cout is used for filtering out the output voltage or current ripple. The logic circuit controls the on-time and off-time of the power switch M1 to achieve the purpose of a switching power supply of voltage type or current type output.

As an embodiment of the present application, the above first switch module 1021 is a triode (shown as a drive switch S1 in FIG. 3) or a field effect transistor.

the base, the collector and the emitter of the triode act as the controlled end, the input end and the output end of the first switch module 1021 respectively;

the gate, the drain and the source of the field effect transistor act as the controlled end, the input end and the output end of the first switch module 1021 respectively.

As an embodiment of the present application, the above second switch module 1022 is a triode (shown as a drive switch S2 in FIG. 3) or a field effect transistor.

the base, the collector and the emitter of the triode act as the controlled end, the input end and the output end of the second switch module 1022 respectively;

the gate, the drain and the source of the field effect transistor act as the controlled end, the input end and the output end of the second switch module 1022 respectively.

As an embodiment of the present application, the above third switch module 1023 is a triode (shown as a drive switch S3 in FIG. 3) or a field effect transistor.

the base, the collector and the emitter of the triode gate electrode the controlled end, the input end and the output end of the third switch module 1023 respectively.

the gate, the drain and the source of the field effect transistor gate electrode the controlled end, the input end and the output end of the third switch module 1023 respectively.

Figure 4:
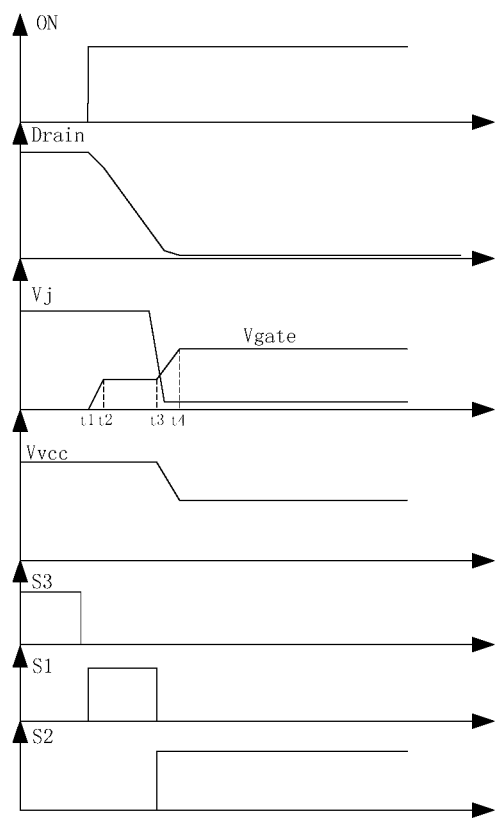
FIG. 4 is a waveform diagram of voltages of each signal points when a power switch is turned on in a power switch drive circuit with a built-in power supply capacitor according to an embodiment of the present application.
Figure 5:
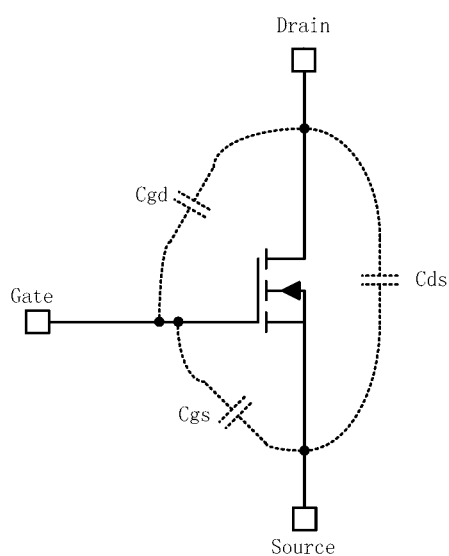
FIG. 5 is a connection structure schematic diagram of a parasitic capacitor of a power switch in a power switch drive circuit with a built-in power supply capacitor according to an embodiment of the present application.
Figure 6:
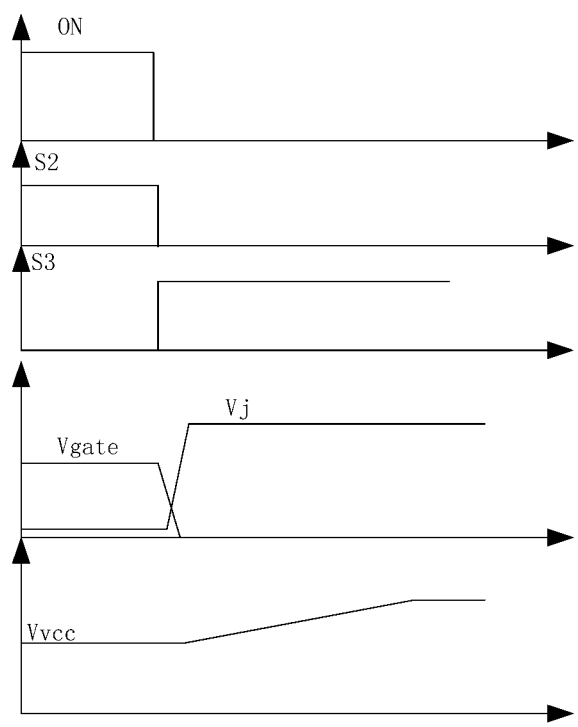
FIG. 6 is a waveform diagram of voltages of each signal points when a power switch is turned off in a power switch drive circuit with a built-in power supply capacitor according to an embodiment of the present application.

FIGS. 4-6 respectively show the waveforms of the voltages of various the signal points when the power switch is turned on, the connection structure of the parasitic capacitor of the power switch, and when the power switch is turned off in the power switch drive circuit with a built-in power supply capacitor according to an embodiment of the present application. The following with reference to FIG. 3 to FIG. 6 to describe the working principle of the power switch drive circuit with a built-in power supply capacitor:

In FIG. 4, the ON signal is the output signal of the logic circuit and changes from low level to high level at time t1.

The drive control circuit receives the ON signal command of the logic circuit and turns on the drive switch S1 at time t1.

From time t1, the current in the field effect transistor JFET flows into the gate of the power switch M1.

Referring to FIG. 5, the power switch M1 has three typical parasitic capacitors: a gate-source capacitor Cgs, a gate-drain capacitor Cgd, and a drain-source capacitor Cds.

Before t1, the drain voltage is higher, typically 100V or more. The gate-drain capacitor Cgd and the drain-source capacitor Cds accumulate more charges.

Between the time t1 and t2, the gate-drain capacitor Cgd, the drain-source capacitor Cds are discharged to the gate-source capacitor Cgs through the junction field effect transistor JFET and the drive switch S1, so that the drain voltage drops. The gate voltage Vgate rises.

At time t2, Vgate rises to the turn-off threshold Vth of the power switch M1, and the power switch M1 starts to turn off.

From t2 to t3, the charge of the gate-drain capacitor Cgd continues to charge the gate voltage Vgate of the power switch M1 through the junction field effect transistor JFET and the drive switch S1, the current in the power switch M1 gradually increases, and the current is also discharges the drain-source capacitor Cds, so that the drain voltage Drain of the power switch M1 drops.

After a fixed time delay or after it is detected that the drain voltage Drain of the power switch M1 drops to a certain value, at time t3, the drive control circuit turns off the drive switch S1 while turning on the drive switch S2.

At t3 to t4, the internal power supply capacitor Cvcc of the chip charges the gate Vgate of the power switch M1 through the drive switch S2, since the power supply capacitor Cvcc is built in the chip, its capacitance is small, and the power supply capacitor Cvcc starts to drop significantly. At time t4, the Vgate voltage reaches the same value as the Cvcc capacitor voltage, completing a turn-on driving process of the power switch M1.

By designing the ratio of the power supply capacitor Cvcc and the gate capacitor of the power switch M1, at time t4, the power supply capacitor Cvcc voltage and the gate capacitor voltage of the power switch M1 satisfy: 1, the power switch M1 obtains the required low on-resistance; 2, the power supply capacitor Cvcc voltage is sufficient to supply the control circuit.

However, in the prior art, a large power supply capacitor Cvcc is needed to complete the entire driving process for turning on the power switch. Therefore, it is necessary to provide all charges required for the gate-source capacitor Cgs and the gate-drain capacitor Cgd, while in the present embodiment, before the drive switch S2 is turned on, the drain voltage has dropped to a lower value, so it is not necessary to provide the charge of the gate-drain capacitor Cgd. Also, the portion of the gate-source capacitor Cgd below the gate threshold is also completed before the drive switch S2 is turned on.

Therefore, it can be seen that, in the prior art, the charge that the power supply capacitor Cvcc needs to provide is: Qg=Cgs*Vgate+Cgd*Vds. In the formula, Vgate is the gate voltage after the power switch M1 finishes driving, Vds is the drain-source voltage when the power switch M1 is turned off. In the present embodiment, the charge that the power supply capacitor Cvcc needs to provide is: Qvcc=Cgs*(Vgate−Vth). In the formula, Vth is the turn-off threshold of the power switch M1. It can be seen that the circuit in this embodiment can greatly reduce the charge that the power supply capacitor Cvcc needs to provide. Therefore, the power supply capacitor Cvcc can be integrated into the control chip to save costs and improve reliability.

Referring to FIG. 6, when the output signal ON of the logic circuit changes from a high level to a low level, the drive control circuit turns off the drive switch S2. At the same time, the output signal OFF of the logic circuit turns on the drive switch S3, and the gate voltage of the power switch M1 starts to drop until 0V, and the drain voltage of the power switch M1 rises to a higher voltage (typically 100-500V). At this time, the junction field-effect transistor JFET can begin to charge the supply capacitor Cvcc, when capacitor voltage of the supply capacitor Cvcc rises to a set value, the junction field-effect transistor JFET is turned off and the voltage on the supply capacitor Cvcc is sufficient for the next power switch M1 to use while turning on instantly.

The advantage of this circuit is that, compared to the prior art, the charge demand of the power supply capacitor when the power switch is turned on can be greatly reduced. Therefore, the power supply capacitor can be designed into the chip to save the externally-packaged power supply capacitor, save the chip pins improve the reliability of the drive circuit and reduce the cost of the drive circuit.

In summary, the present application provides a power switch drive circuit with a built-in power supply capacitor, when the power switch reaches the turn-on threshold, it is discharged through the power supply capacitor to turn on the power switch, thereby saving the charge requirement on the power supply capacitor, and enabling a small-capacity power supply capacitor to realize power switch driving. At the same time, the power supply capacitor can be designed in an integrated circuit to improve reliability and reduce costs, therefore, it can solve the problem that the capacity of the power supply capacitor is too large to be able to be designed on the integrated circuit, which results in a large occupied space and an increased cost.

Persons of ordinary skill in the art may understand that the steps or some steps of implementing the above method embodiments may be accomplished by program instructions related hardware, and the above program may be stored in a computer-readable storage medium. When the program is executed, the execution comprises: the steps of the above method embodiment, and the above storage medium comprises various media that can store program codes, such as a ROM, a RAM, a magnetic disk, or an optical disc.

The aforementioned embodiments are only used to illustrate the technical solutions of the present application, rather than limiting thereof; although the present application has been described in detail with reference to the foregoing embodiments, persons of ordinary skill in the art should understand that they can still modify the technical solutions described in the above embodiments, or equivalently replace some of the technical features; and these modifications or replacements do not make the nature of the corresponding technical solutions depart from the spirit and scope of the technical solutions of the embodiments of the present application.

The aforementioned embodiments are only preferred embodiments of the present application, and are not intended to limit the present application. Any modification, equivalent replacement, improvement, and so on, which are made within the spirit and the principle of the present application, should be included in the scope of the present utility model. Therefore, the scope of the present application is subject to the scope of the claims.

The invention claimed is:

1. A power switch drive circuit with a built-in power supply capacitor, the power switch drive circuit comprises a drive unit, the drive unit comprises a power switch, a junction field effect transistor, a field effect transistor control circuit, and a drive control circuit, the drive unit also comprises:

a logic circuit, a power supply diode, a first switch module, a second switch module, a third switch module, and the power supply capacitor;

an output end of the field effect transistor control circuit is connected with a gate of the junction field effect transistor, a drain of the junction field effect transistor and an input end of the power switch are connected with a power supply unit, a source of the junction field effect transistor, an input end of the first switch module, a connection end of the drive control circuit, and an anode of the power supply diode are connected in common; a first control end of the drive control circuit is connected with a controlled end of the first switch module, a second control end of the drive control circuit is connected with a controlled end of the second switch module, a cathode of the power supply diode and a first end of the power supply capacitor, and an input end of the second switch module are connected in common, an output end of the first switch module, an output end of the second switch module, an input end of the third switch module, and a controlled end of the power switch are connected in common, a second end of the power supply capacitor and an output end of the third switch module are grounded, a control end of the logic circuit is connected with a controlled end of the drive control circuit, an output of the logic circuit is connected with a controlled end of the third switch module, an connection end of the logic circuit and an output end of the power switch are connected in common with an output unit;

the direct current output by the power supply unit is configured to not only charge the power supply capacitor but also supply power to the power switch;

the drive control circuit is configured to control the first switch module to be turned on when the logic circuit outputs a turn-on control signal, and the drive control circuit is configured to control the first switch module to be turned off and the second switch module to be turned on when the power switch reaches a turn-on threshold such that the power supply capacitor is discharged to turn on the power switch; and the third switch module is configured to be turned on when the logic circuit outputs a turn-off control signal, and the drive control circuit is configured to control the second switch module to be turned off, so that the power supply capacitor is charged and the power switch is turned off.

2. The power switch drive circuit of claim 1, wherein the power supply comprises:

an alternating current power supply, a first diode, a second diode, a third diode, a fourth diode and the bus capacitor;

a first output end of the alternating current power source, an anode of the first diode and a cathode of the third diode are connected in common, a second output end of the alternating current power source, a cathode of the fourth diode D4 and an anode of the second diode are connected in common, a cathode of the first diode, a cathode of the second diode and the first end of the bus capacitor are connected in common and serves as an output end of the power supply unit, an anode of the third diode, an anode of the fourth diode and a second end of the bus capacitor are connected in common.

3. The power switch drive circuit of claim 2, wherein the output unit comprises:

a sampling resistor, a inductor, an output capacitor, a freewheel diode, and load;

a first end of the sampling resistor and a cathode of the freewheel diode are connected to serve as an input end of the output unit, a second end of the sampling resistor and a first end of the inductor are grounded, and a second end of the inductor, a first end of the output capacitor and a first end of the load are connected in common, an anode of the freewheel diode, a second end of the output capacitor and a second end of the load are connected in common and is connected with a second end of the bus capacitor.

4. The power switch drive circuit of claim 1, wherein the first switch module is a triode or a field effect transistor;

a base, a collector and an emitter of the triode act as a controlled end, an input end and an output end of the first switch module respectively;

a gate, a drain and a source of the field effect transistor act as a controlled end, an input end and an output end of the first switch module respectively.

5. The power switch drive circuit of claim 1, wherein the second switch module is a triode or a field effect transistor;

a base, a collector and an emitter of the triode act as a controlled end, an input end and an output end of the second switch module respectively;

a gate, a drain and a source of the field effect transistor act as a controlled end, an input end and an output end of the second switch module respectively.

6. The power switch drive circuit of claim 1, wherein the third switch module is a triode or a field effect transistor;

a base, a collector and an emitter of the triode act as a controlled end, an input end and an output end of the third switch module respectively;

a gate, a drain and a source of the field effect transistor act as a controlled end, an input end and an output end of the third switch module respectively.

* * * * *